United States Patent [19]

Lange et al.

[11] Patent Number: 5,173,767
[45] Date of Patent: Dec. 22, 1992

[54] INTEGRATED CIRCUIT HOUSING COMPOSED OF THREE COATED, DIELECTRIC PLATES

[75] Inventors: Friedrich Lange, Groebenzell; Roland Ressel, Munich, both of Fed. Rep. of Germany

[73] Assignee: Siemens Aktiengesellschaft, Munich, Fed. Rep. of Germany

[21] Appl. No.: 701,848

[22] Filed: May 17, 1991

[30] Foreign Application Priority Data

May 28, 1990 [DE] Fed. Rep. of Germany ....... 4017156

[51] Int. Cl.$^5$ ..................... H01L 23/12; H01L 23/14
[52] U.S. Cl. .................... 257/664; 257/700; 257/728
[58] Field of Search ............ 357/74, 68, 80, 75

[56] References Cited

U.S. PATENT DOCUMENTS

| | | | |
|---|---|---|---|
| 4,551,746 | 11/1985 | Gilbert et al. | 357/74 |
| 4,551,747 | 11/1985 | Gilbert et al. | 357/74 |
| 4,561,006 | 12/1985 | Currie | 357/28 |
| 4,667,219 | 5/1987 | Lee et al. | 357/68 |
| 4,667,220 | 5/1987 | Lee et al. | 357/68 |
| 4,890,155 | 12/1989 | Miyagawa et al. | 357/80 |
| 4,922,325 | 5/1990 | Smeltz, Jr. | 357/80 |
| 4,930,002 | 5/1990 | Takenaka et al. | 357/80 |
| 4,965,702 | 10/1990 | Lott et al. | 357/80 |
| 5,063,432 | 11/1991 | Mu | 357/80 |

FOREIGN PATENT DOCUMENTS 0272188 6/1988 European Pat. Off. .

OTHER PUBLICATIONS

"Multilayer Ceramic Design Manual" Tri Quint, Semiconductor Inc., 1989, Rev. 1.0, pp. 1–11, Appendix A, Appendix B.
"Integrierte Mikrowellenschaltungen" from the book of R. K. Hoffmann, Pub. Springer, Berlin, Heidelberg, New York, Tokyo, 1983, pp. 92–97.

Primary Examiner—Rolf Hille
Assistant Examiner—S. V. Clark
Attorney, Agent, or Firm—Hill, Van Santen, Steadman & Simpson

[57] ABSTRACT

Integrated circuit housing composed of three coated dielectric plates. The integrated circuit housing with the three coated dielectric plates has a signal plane, a supply voltage plane and ground planes. Signal lines located in the signal plane are fashioned as triplate lines and for a reflection-free termination of the signal lines integrated resistors are provided in the signal plane. The supply voltage plane is insulated from the two surrounding ground planes by a coating of dielectric material.

13 Claims, 7 Drawing Sheets

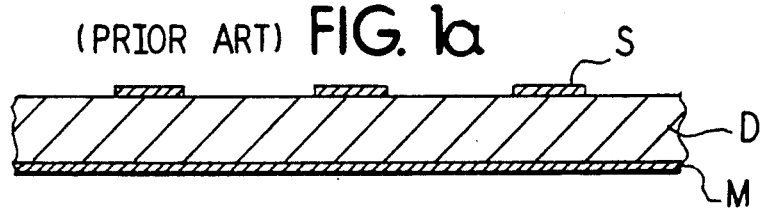
(PRIOR ART) FIG. 1a
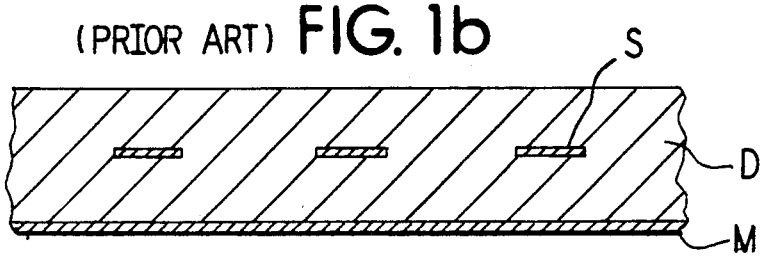
(PRIOR ART) FIG. 1b
FIG. 2
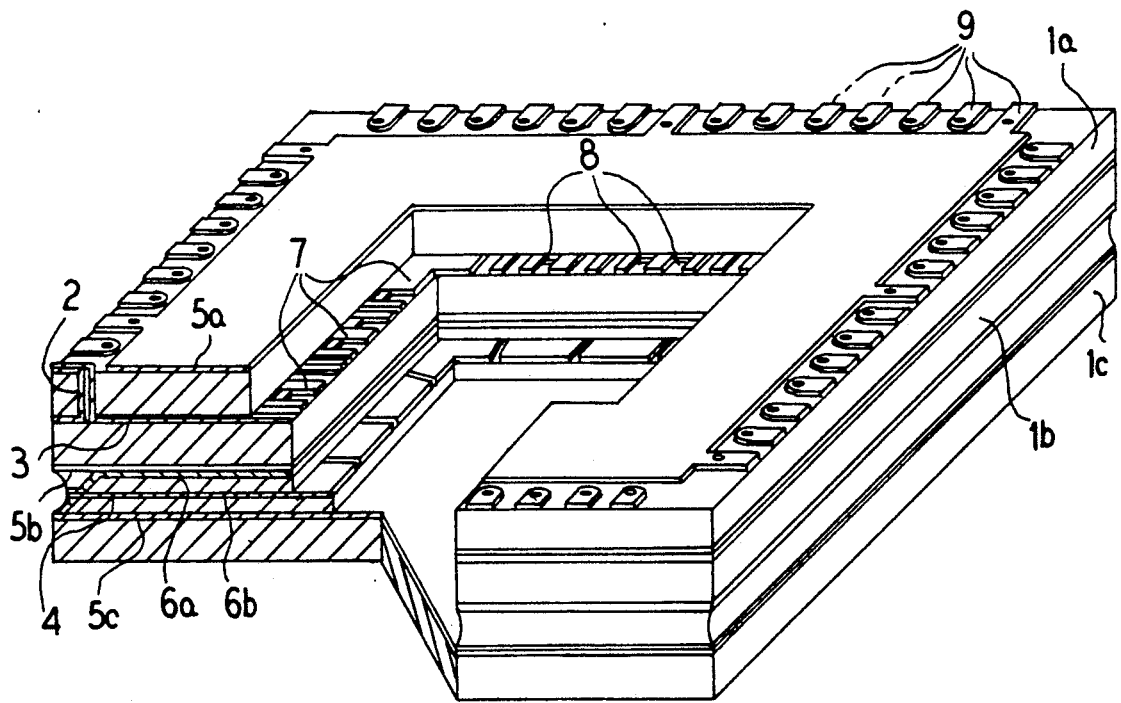

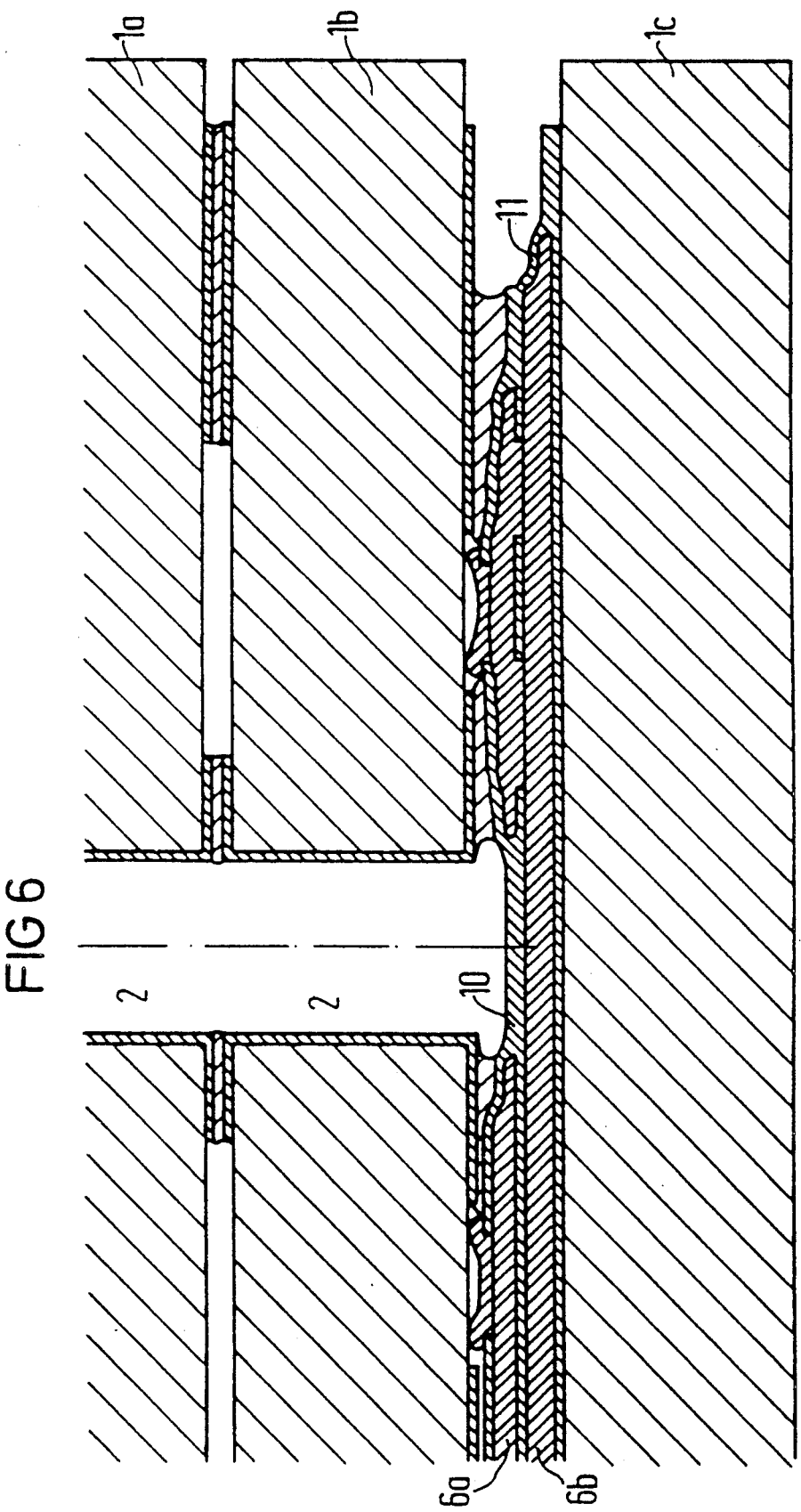

(PRIOR ART) FIG 7
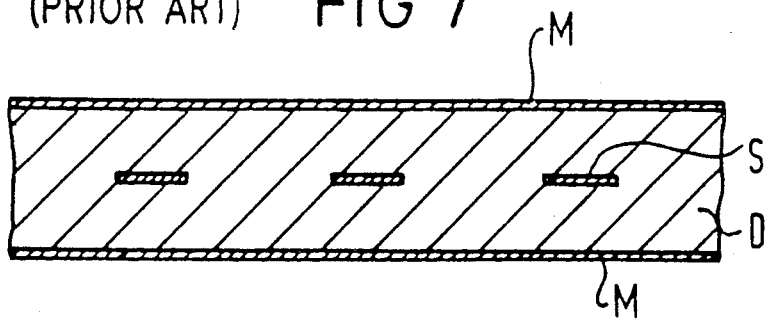
FIG 8
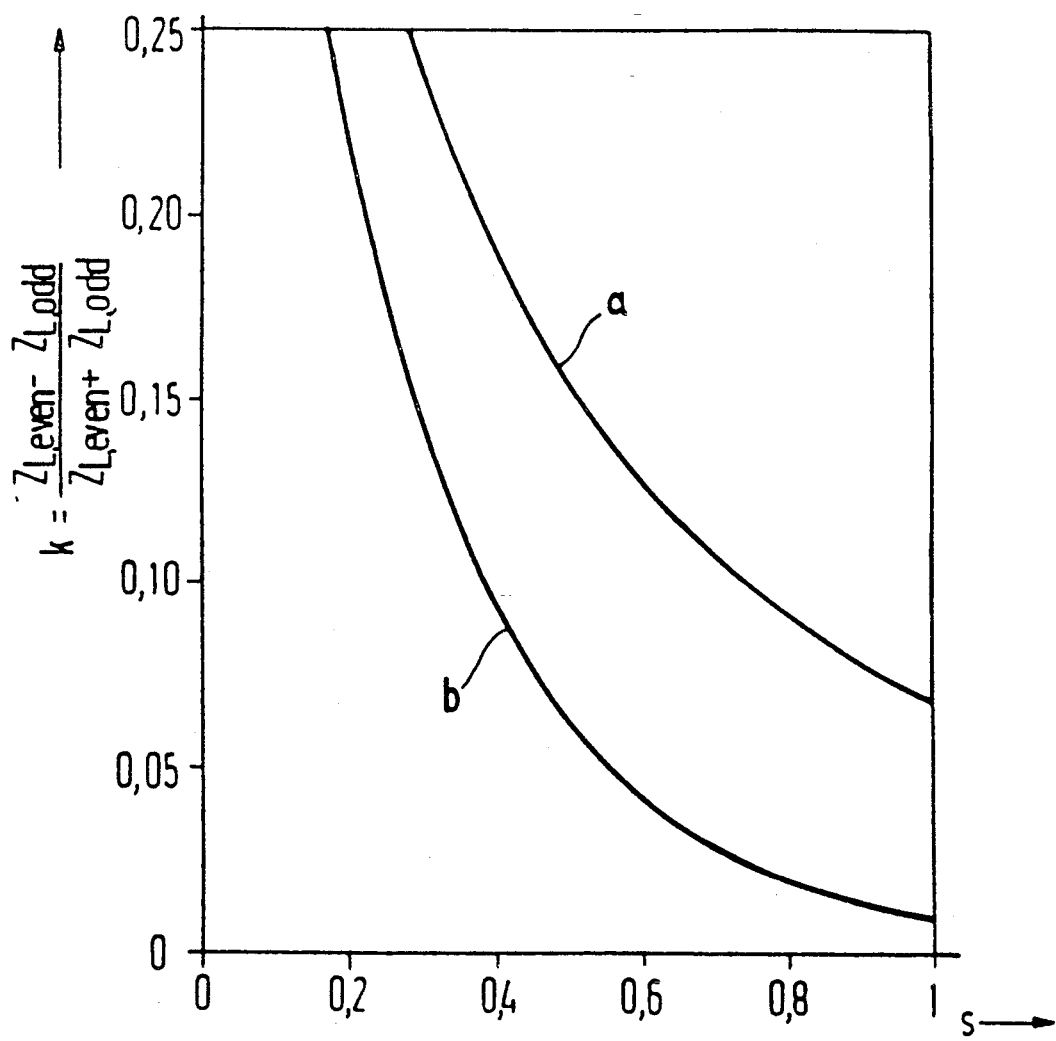

$\varepsilon_r = 9.8$
$h = 0.381$ mm
$w_m = 0.21$ mm $\varepsilon_r = 9.8$
$h = 0.381$ mm
$w_t = 0.13$ mm

INTEGRATED CIRCUIT HOUSING COMPOSED OF THREE COATED, DIELECTRIC PLATES

BACKGROUND OF THE INVENTION

The present invention relates to a housing for integrated circuits.

Prior art housings for integrated circuits, hereinafter referred to as IC-housings, are known in particular from page 1 of the reference "Multilayer Ceramic Design Manual", Tri Quint, Semiconductor, Inc. 1989, Revision 1.0, p. 1-11, Appendix A, Appendix B. Also, in the book of Reinmut K. Hoffmann "Integrierte Mikrowellenschaltungen" (Integrated microwave circuits), Publisher Springer, Berlin, Heidelberg, New York, Tokyo, 1983, coupled microstrip lines are described on page 95. The important details regarding IC-housings will again be explained later in connection with FIG. 1a and FIG. 1b.

An IC-housing is supposed to fulfill the following specific requirements, namely a decoupling of signal lines, a high reflection loss even for IC-inputs mismatched in high-impedance fashion and finally a good smoothing of load peaks of dc voltage supplies.

In conventional IC-housings, generally microstrip lines with or without dielectric covering are used as conductor types (see FIG. 1). In the case of these conductor types, the mutual decoupling of adjacent lines is not sufficient for many applications, for example, for large differences in the swing of signals (such as mixed application of ECL-levels, TTL-levels and, CMOS-levels) and for steep switching slopes.

In order to improve decoupling, only each second or third line is used as a signal line, for example, and the lines in between are connected to ground. This method is only moderately effective. In order to increase reflection loss, external compensation measures must be performed on the printed circuit board. In some cases, the problem of smoothing load peaks can be solved by blocking-capacitors which are accommodated on the IC-housing or externally on the printed circuit board. It may also be necessary, however, to modify the IC-layout in order to place disturbing loads at different locations.

SUMMARY OF THE INVENTION

It is an object of the present invention to provide an IC-housing containing a signal plane, a supply voltage plane and ground planes, that guarantees a high decoupling of the signal lines, a high reflection loss even with IC-inputs mismatched in high-impedance fashion, and a good smoothing of peak loads of the dc voltage supply.

The present invention is an integrated circuit housing composed of three coated dielectric plates, which are connected by brazing, soldering or adhesion and that has a signal plane, a supply voltage plane and ground planes. Signal lines lying in the signal plane are fashioned as triplate lines. For the reflection-free termination of the signal lines, integrated resistors are provided in the signal plane, and the supply voltage plane is insulated from the two surrounding ground planes by a coating of dielectric material.

In further advantageous embodiments of the present invention the dielectric plates are made by the application of standard-layer technology on Al,O-ceramic (aluminum-oxide-ceramic) in the form of solid plates instead of using a "tape on substrate" dielectric medium (plastic foil with ceramic powder). Electrical connections through dielectric plates are realized by through-contacts, which are covered in a hermetically sealing fashion by a dielectric coating. Supply voltage metalizations are electrically connected in a surrounding fashion, wherein one surrounding metalization is in the supply voltage plane and another is in the signal plane. Electrical contacting through a middle ground plane to the supply voltage plane is provided by crater-shaped structures. The middle and lower ground planes are contacted with one another in a surrounding fashion by a down-pulled metalization.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several FIGS. in which like reference numerals identify like elements, and in which:

FIG. 1a is a cross-sectional view of prior art microstrip lines;

FIG. 1b is a cross-sectional view of prior art microstrip lines with dielectric covering;

FIG. 2 is a perspective view of an IC-housing, namely an exemplary embodiment without a cover;

FIG. 6 is a cross-sectional view of the IC-housing depicting vertical electrical connections, metalization (close hatching), dielectric plates (wide hatching), dielectric coating (close hatching), brazing material (hatching);

FIG. 7 is a cross-sectional view showing actually known triplate-lines, whereby the strip conductors S are embedded in a dielectric D on which are two ground planes M; and FIG. 8 is a graph depicting curves a and b of the coupling factor $k = (Z_{L,even} - Z_{L,odd})/(Z_{L,even} + Z_{L,odd})$ as a function of the conductor distance s, curve a corresponding to FIG. 9a for coupled microstrip lines in the homogeneous dielectricum, and curve b corresponding to FIG. 9b for coupled triplate lines.

DESCRIPTION OF THE PREFERRED EMBODIMENT

Figure 3:
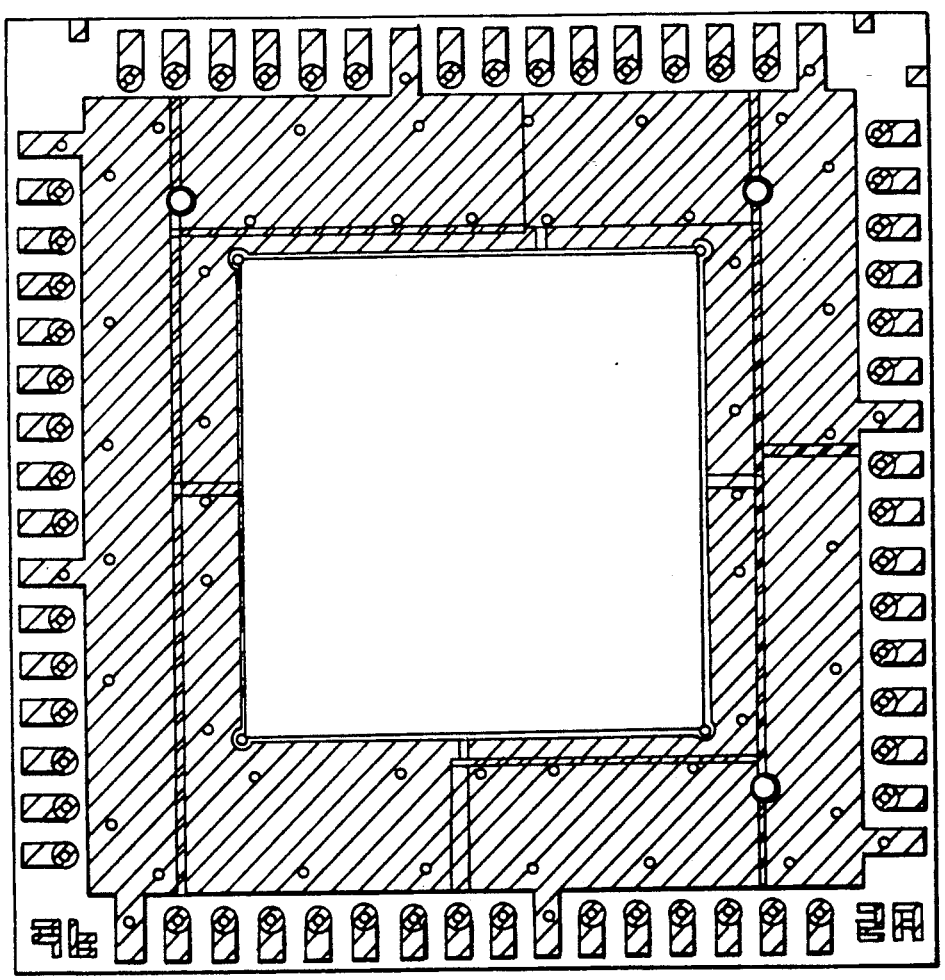
FIG. 3 is a plan view of an exemplary embodiment of the ground plane 5a of FIG. 2, wherein the diagonal hatching represents metalized areas and the small circles represent locations of metalized throughcontacts in metalized areas.

FIG. 1a shows a microstrip line and FIG. 1b shows a microstrip line with a dielectric covering according to the initially cited reference "Integrated microwave circuits", page 95. The microstrip lines have a strip conductor S, a dielectric medium D and a ground M.

For the description of the IC-housing of the present invention, FIG. 2 shows important parts of the structure. The FIGS. 3 to 5 give examples for typical structuring of individual metal coated planes and FIG. 6 is a cross-sectional view illustrating the vertical connection technique.

The IC-housing of the present invention is composed of three coated dielectric plates 1a, 1b, 1c, e.g. of Al$_2$O$_3$—ceramic, which are connected with one another by brazing, soldering or adhesion and which are hermetically sealed towards the outside. The electrical connections through the dielectric plates are provided by metallic throughcontacts 2 (see FIG. 6). The differentiation between the different metalized planes is made according to their essential functions and they are characterized as signal plane 3 (see FIG. 4), supply voltage plane 4 (see FIG. 5) and ground planes 5a (see FIG. 3), 5b, 5c. The metalization is provided, that is, by screen printing methods or by vacuum coating. The supply voltages at the metalizations U and V, are insulated from the ground planes by dielectric coating (e.g. dielectric printing or vacuum coating) 6a, 6b. The connections through the ground plane 5b to the supply voltage metalizations are provided by crater-shaped structures 10 and the connection of the ground plane 5b to the ground plane 5c is provided by a pulled-down metalization 11 (see FIG. 6).

Figure 4:
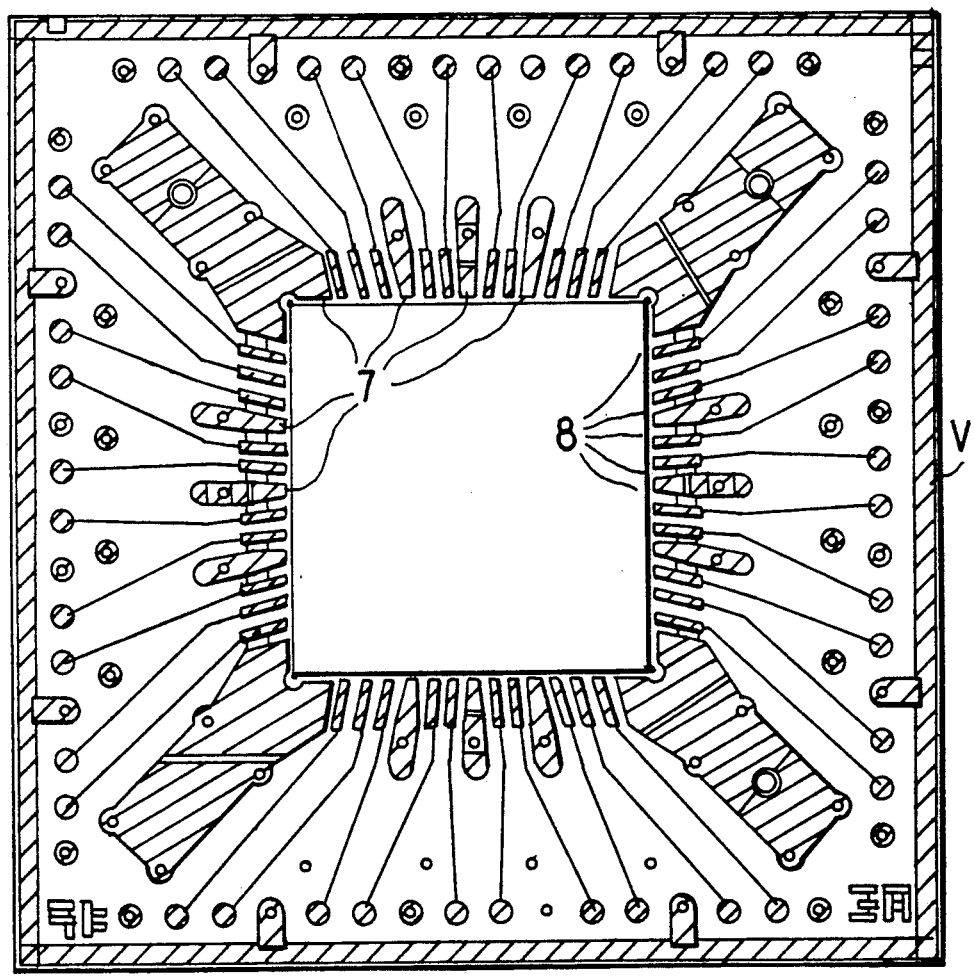
FIG. 4 is a plan view of the signal plane 3 of FIG. 2, wherein the diagonal hatchings are metalized areas.
Figure 5:
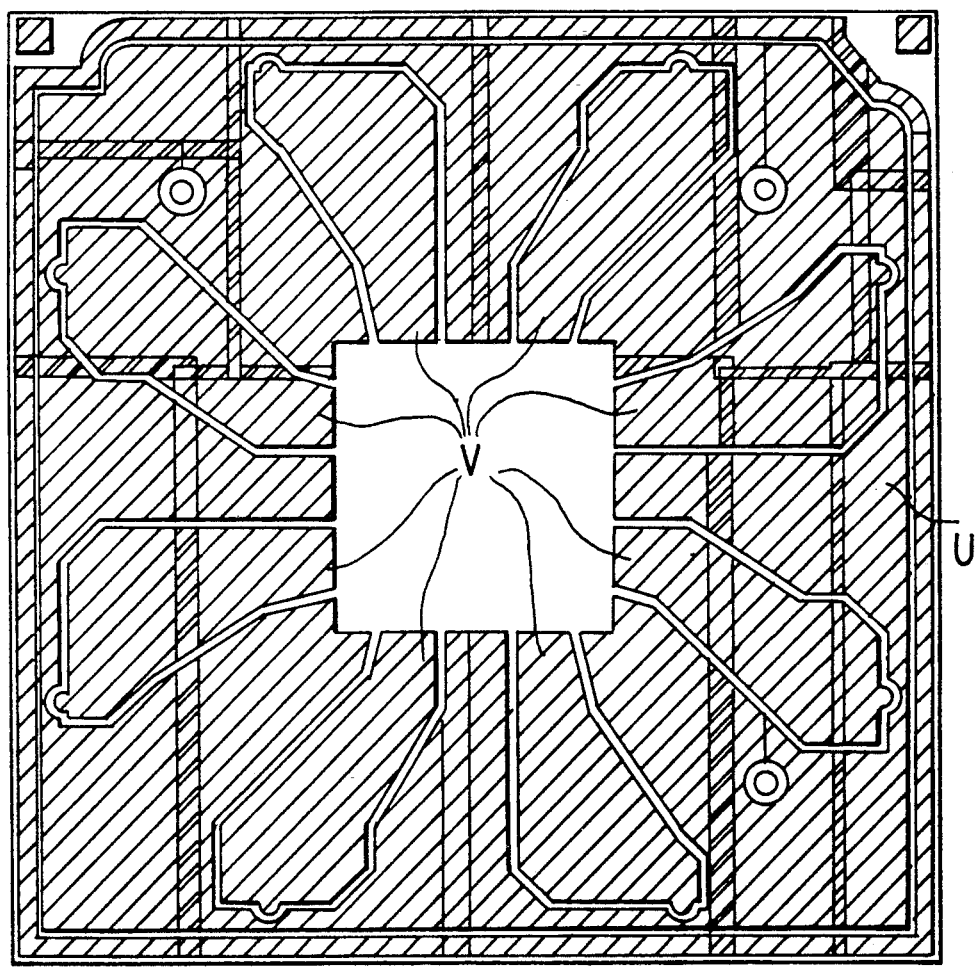
FIG. 5 is a plan view of the supply voltage plane 4 of FIG. 2, wherein the diagonal hatching represents metalized surfaces.

In FIGS. 3, 4 and 5, metalized areas are characterized by diagonal hatching and small circles represent locations of metalized throughcontacts in metalized areas. In FIGS. 4 and 5 the metalizations U and V carry the supply voltages.

A bottom side of the integrated circuit is on the ground plane 5c in the housing-interior. The connection of the upper side of the integrated circuit with signals, supply voltages and ground M occurs via bonding. For the application of these bonded connections contact regions are provided in the IC-housing in the signal plane 3 and the supply voltage plane 4. In order to enable ground connections via bond wires, the ground M is guided at diverse locations out of the ground plane 5b via metallic throughcontacts in the contact region of the signal plane 3 to contacts 7. These contacts 7 are also used to switch signal lines to ground M via integrated terminating resistors 8.

In FIG. 6, parts operating in the same manner are denoted with the same reference symbols as in the other figures. A close diagonal hatching characterizes a metalization, a wide hatching characterizes dielectric plates, a close hatching in the other diagonal direction characterizes a dielectric coating, and finally, diagonal hatched areas represent solder or brazing material. FIG. 6 is a cross-sectional view through the IC-housing showing the vertical electrical connections. The supply voltage plane 4 (also see FIG. 5) is insulated from the two surrounding ground planes 5b, 5c via coating with dielectric material 6a, 6b, e.g. by printing with dielectric paste QP445 of DuPont Electronics (permitivity $e_r = 6 \ldots 8$). The above material is commercially available and described in business catalogs of DuPont.

The outside contacts 9 of the IC-housing are located in the upper ground plane 5a. The connection to the printed circuit board can be provided e.g. via metal bands, which are jointly soldered on the IC-housing in the form of a metal spider. The IC-housing is hermetically sealed by metallic or dielectric covering. Throughcontacts which reside outside this covering are hermetically sealed by dielectric coating. When a dielectric cover is used (e.g. ceramic cap) this coating can occur in a surface like fashion across the entire upper plate 1a, whereby the contact region for the metal spider must remain free.

The structure of actually known triplate lines is shown in FIG. 7. The strip conductors S are embedded in a dielectric medium D and two ground planes M exist on the upper and lower sides of the dielectric medium D.

FIG. 8 shows the coupling factor k of coupled lines between the values s=0 and s=1 mm as an example. The coupling factor k is defined as $(Z_{L,even} - Z_{L,odd})/(Z_{L,even} + Z_{L,odd})$. The curve "a" shows the result for coupled microstrip lines in a homogeneous dielectric medium, the curve "b" shows the result for coupled triplate lines. The curves are valid for the values $\epsilon_r = 9.8$, h=0.381 mm, $w_m = 0.21$ mm and $w_t = 0.13$ mm, as shown in FIG. 9a and FIG. 9b.

The signal lines are executed as triplate-lines corresponding to FIG. 7. The two ground planes of this conductor type are maintained at the same potential by regular connections via metallic throughcontacts. This conductor type enables a relatively high decoupling.

Figure 9A:
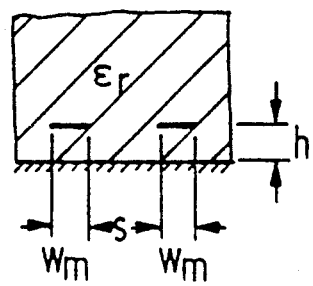
Figure 9B:
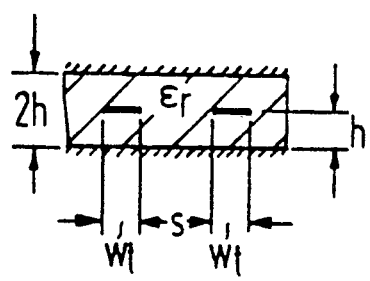

In a simple model-like comparison, FIG. 8 in conjunction with FIGS. 9a and 9b compares the calculated coupling factors for coupled microstrip lines in the homogeneous dielectric medium and coupled triplate lines. The conductor widths are thereby respectively selected such that the characteristic impedances for the decoupling i.e. for a very large gap width s→∞, are 50 ohms, which is equivalent to s/w >> 1. The signal lines are guided through the IC-housing with the defined characteristic impedance (e.g. $Z_L = 50$ ohms) necessary for matching. Signal lines leading to IC-inputs mismatched in high-impedance fashion are switched to ground in matched fashion via integrated resistors 8. The ground is thereby drawn out of the ground plane 5b in the signal plane 3 at various locations via metallic throughcontacts. The integrated resistors 8 can be applied e.g. by thick-film printing. In the case of a variation of the IC-contacts which need in parallel an integrated terminating resistor, only the mask of the resistor print must be changed.

The supply voltage plane 4 (see also FIG. 5) is insulated from the two surrounding ground planes 5b, 5c by coating with dielectric material 6a, 6b, e.g. printing with the dielectric medium paste QP455 of DuPont Electronics (permitivity $\epsilon_r = 6 \ldots 8$). As a result, the dc voltage supplies are highly capacitive and of low inductivity. High-frequency load peaks are then particularly well smoothed because the local capacitance in the direct area of the contacts to the IC is also very high. The connections through the ground plane 5b to the supply voltage metalizations are provided by crater-shaped structures 10 and the connection of the ground plane 5b to the ground plane 5c is provided by down-pulled metalization 11, as revealed by FIG. 6.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An integrated circuit housing composed of first, second and third coated dielectric plates which are connected by brazing, soldering or adhesion and having a signal plane located between the first and second dielectric plates, a supply voltage plane located between the second and third dielectric plates, and a plurality of ground planes, first and second ground planes of the plurality of ground planes being located between the supply voltage plane and the second dielectric plate and the supply voltage plane and the third dielectric plate, respectively, comprising:

signal lines lying in the signal plane, the signal lines being triplate lines;

integrated resistors in the signal plane for reflection-free termination of the signal lines; and the supply voltage plane being insulated from the first and second ground planes of the plurality of ground planes by first and second coatings, respectively, of dielectric material, the first coating of dielectric material being located between the supply voltage plane and the first ground plane and the second coating of dielectric material being located between the supply voltage plane and the second ground plane.

2. The integrated circuit housing according to claim 1, wherein the first, second and third coated dielectric plates are composed of aluminum-oxide-ceramic in the form of solid plates.

3. The integrated circuit housing according to claim 1, wherein electrical connections are provided through the first and second electrical plates by throughcontacts, the throughcontacts being hermetically covered toward an outside of the housing by dielectric coating.

4. The integrated circuit housing according to claim 1, wherein first and second supply voltage metalizations are electrically connected by respective first and second metallic connections proceeding circumferentially on a surface at an outer edge of the supply voltage plane and on a surface at an outer edge of the signal plane, respectively, the first metallic connection being in the supply voltage plane and the second metallic connection being in the signal plane.

5. The integrated circuit housing according to claim 1, wherein electrical connections through the first ground plane of the plurality of ground planes to the supply voltage plane is provided by crater-shaped structures.

6. The integrated circuit housing according to claim 1, wherein first and second ground planes of the plurality of round planes are electrically connected to one another in a peripheral configuration by a pulled-down metalization.

7. An integrated circuit housing comprising: at least first, second and third coated dielectric plates, a signal plane located between the first and second coated dielectric plates, a supply voltage plane located between the second and third coated dielectric plates, and at least first, second and third ground planes; the signal plane having signal lines, the signal lines being triplate lines, and the signal plane having integrated resistors for the reflection-free termination of the signal lines; and the supply voltage plane being insulated from the second and third ground planes by first and second coatings of dielectric material, respectively, the first ground plane being located on an outer surface of the first coated dielectric plate, the second ground plane being located between the second coated dielectric plate and the first coating of dielectric material on the supply voltage plane, and the third ground plane being located between the second coating of dielectric material on the supply voltage plane and the third coated dielectric plate.

8. The integrated circuit housing according to claim 7, wherein the first, second and third coated dielectric plates and composed of aluminum-oxide ceramic in the form of solid plates.

9. The integrated circuit housing according to claim 7, wherein electrical connections are provided through the first and second dielectric plates by throughcontacts, the throughcontacts being hermetically covered toward an outside of the housing by dielectric coating.

10. The integrated circuit housing according to claim 7, wherein first and second supply voltage metalizations are electrically connected by respective first and second metallic connections proceeding circumferentially on a surface at an outer edge of the supply voltage plane and on a surface at an outer edge of the signal plane, respectively, the first metallic connection being in the supply voltage plane and the second metallic connection being in the signal plane.

11. The integrated circuit housing according to claim 7, wherein electrical connections through the second ground plane to the supply voltage plane are provided by crater-shaped structures.

12. The integrated circuit housing according to claim 7, wherein he second and third ground planes are connected to one another in a peripheral configuration by a pulled-down metalization.

13. An integrated circuit housing comprising: at least first, second and third coated dielectric plates, a signal plane located between the first and second coated dielectric plates, a supply voltage plane located between the second and third coated dielectric plates, and at least first, second and third ground planes, the signal plane having signal lines, the signal lines being triplate lines, and the signal plane having integrated resistors for the reflection-free termination of the signal lines; the supply voltage plane being insulated from the second and third ground planes by first and second coatings of dielectric material, respectively, the first ground plane being located on an outer surface of the first coated dielectric plate, the second ground plane being located between the second coated dielectric plate and the first coating of dielectric material on the supply voltage plane and the third ground plane being located between the second coating of dielectric material on the supply voltage plane and the third coated dielectric plate; electrical connections provided through the first and second dielectric plates by throughcontacts, the throughcontacts being hermetically covered toward an outside of the housing by dielectric coating; first and second supply voltage metalizations electrically connected by respective first and second metallic connections proceeding circumferentially on a surface at an outer edge of the supply voltage plane and on a surface at an outer edge of the signal plane, respectively, the first metallic connection being in the supply voltage plane and the second metallic connection being in the signal plane; electrical connections through the second ground plane to the supply voltage plane provided by crater-shaped structures; and the second and third ground planes connected to one another in a peripheral configuration by a pulled-down metalization.

* * * * *